US010163991B2

(12) United States Patent
Seol et al.

(10) Patent No.: US 10,163,991 B2
(45) Date of Patent: Dec. 25, 2018

(54) DISPLAY DEVICE

(71) Applicant: Samsung Display Co., Ltd., Yongin-si, Gyeonggi-do (KR)

(72) Inventors: Younggug Seol, Yongin-si (KR); Juchan Park, Yongin-si (KR); Sunhee Lee, Yongin-si (KR); Pilsuk Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/722,902

(22) Filed: Oct. 2, 2017

(65) Prior Publication Data
US 2018/0108717 A1 Apr. 19, 2018

(30) Foreign Application Priority Data
Oct. 17, 2016 (KR) .......................... 10-2016-0134542

(51) Int. Cl.
| | | |
|---|---|---|
| *H01L 27/32* | (2006.01) | |
| *H01L 51/52* | (2006.01) | |
| *H01L 51/00* | (2006.01) | |
| *H01L 27/12* | (2006.01) | |

(52) U.S. Cl.
CPC ...... *H01L 27/3244* (2013.01); *H01L 27/3211* (2013.01); *H01L 51/0097* (2013.01); *H01L 51/5237* (2013.01); *H01L 27/1255* (2013.01)

(58) Field of Classification Search
CPC ......... H01L 51/52; H01L 51/56; H01L 27/32; H01L 27/124; H01L 27/1255; H01L 27/3211; H01L 27/3262; H01L 27/3276; H01L 27/3258
USPC ......................................................... 257/72
See application file for complete search history.

(56) References Cited

U.S. PATENT DOCUMENTS

| | | | |
|---|---|---|---|
| 7,022,591 B2 * | 4/2006 | Chang ................. | C23C 14/5813 257/E21.134 |
| 9,496,510 B2 | 11/2016 | Kim et al. | |
| 2013/0062659 A1 * | 3/2013 | Lee .................... | H01L 29/78603 257/103 |
| 2014/0346473 A1 | 11/2014 | Park et al. | |
| 2016/0195248 A1 | 7/2016 | Sun et al. | |

FOREIGN PATENT DOCUMENTS

| | | |
|---|---|---|
| KR | 10-2014-0137950 A | 12/2014 |
| KR | 10-2016-0047132 A | 5/2016 |
| KR | 10-2014-0123364 A | 10/2017 |

* cited by examiner

*Primary Examiner* — Chuong A Luu
(74) *Attorney, Agent, or Firm* — Innovation Counsel LLP

(57) ABSTRACT

A display device includes a substrate comprising a first plastic layer, a second plastic layer on the first plastic layer, and an inorganic layer between the first plastic layer and the second plastic layer, an inorganic embossed layer on the substrate and comprising a plurality of mountain parts, an organic layer on the inorganic embossed layer, an inorganic buffer layer on the organic layer, a thin film transistor on the inorganic buffer layer, and a display element electrically connected to the thin film transistor.

15 Claims, 8 Drawing Sheets

DISPLAY DEVICE

CROSS-REFERENCE TO RELATED APPLICATION

This application claims the benefit of Korean Patent Application No. 10-2016-0134542, filed on Oct. 17, 2016, in the Korean Intellectual Property Office, the disclosure of which is incorporated herein in its entirety by reference.

BACKGROUND

1. Field

One or more embodiments relate to display devices.

2. Description of the Related Art

Display devices have been developed for various uses. Furthermore, as the thickness and weight of a display device decrease, a range of the use of display devices has become wider. As the display device is diversely used, a variety of methods are being researched to design the shape of a display device.

SUMMARY

One or more embodiments relate to display devices, and disclose a structure of a flexible display device.

Additional aspects will be set forth in part in the description which follows and, in part, will be apparent from the description, or may be learned by practice of the presented embodiments.

According to one or more embodiments, a display device includes a substrate comprising a first plastic layer, a second plastic layer on the first plastic layer, and an inorganic layer between the first plastic layer and the second plastic layer, an inorganic embossed layer on the substrate and comprising a plurality of mountain parts, an organic layer on the inorganic embossed layer, an inorganic buffer layer on the organic layer, a thin film transistor on the inorganic buffer layer, and a display element electrically connected to the thin film transistor.

The inorganic embossed layer may include a valley part between neighboring mountain parts of the plurality of mountain parts, and a part of the organic layer may be arranged in the valley part.

A depth of the valley part may be equal to or smaller than a height of each of he plurality of mountain parts.

The inorganic embossed layer may include at least one of silicon oxide and silicon nitride.

The display device may further include a metal pattern layer located to correspond to the plurality of mountain parts, the metal pattern layer being between the inorganic embossed layer and the organic layer.

The metal pattern layer may include at least one of molybdenum, titanium, and titanium nitride.

The metal pattern layer may include an opening corresponding to neighboring mounting parts of the plurality of mountain parts.

The display device may include an additional inorganic layer disposed between the inorganic embossed layer and the organic layer.

The additional inorganic layer may have an uneven surface conforming to the plurality of mountain parts of the inorganic embossed layer.

The first plastic layer and the second plastic layer may be flexible.

The substrate may include a first surface facing the inorganic embossed layer and a second surface opposite to the first surface, and the display device may further include a backing film on the second surface of the substrate.

The display device may further include an adhesive layer disposed between the substrate and the backing film.

The thin film transistor may include semiconductor layer and a gate electrode overlapping a channel area of the semiconductor layer.

Any one of the semiconductor layer and the gate electrode may contact the inorganic buffer layer.

The display element may include a pixel electrode electrically connected to the thin film transistor, an emission layer on the pixel electrode, and a counter electrode on the emission layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
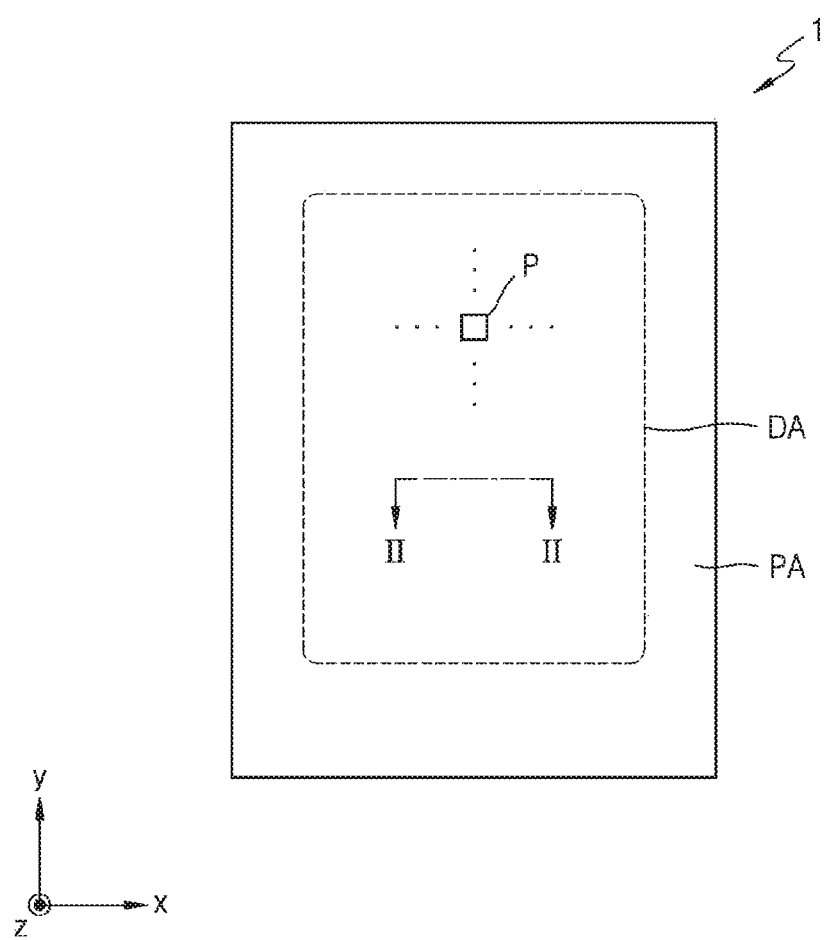
FIG. 1 is a schematic plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the inventive concept allows for various changes and numerous embodiments, embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of the related art are omitted when it is deemed that they may unnecessarily obscure the essence of the inventive concept.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component or indirectly connected to the other layer, region, or component via intervening layers, regions, or components. For example, in the present specification, when a layer, region, or component is referred to as being electrically connected to another layer, region, or component, it can be directly electrically connected to the other layer, region, or component or indirectly electrically connected to the other layer, region, or component via intervening layers, regions, or components.

FIG. 1 is a schematic plan view of a display device 1 according to an embodiment.

Referring to FIG. 1, the display device 1 may include a display area (active area) DA and a peripheral area PA that is a non-display area (inactive area). In the display area DA, a plurality of pixels P including a display element such as an organic light-emitting device (OLED) are arranged and provide a certain image. The peripheral area PA is an area that does not provide an image, and includes a driver such as a scan driver and a data driver for transmitting electrical signals and power to the pixels P of the display area DA, signal lines such as scan lines and data lines, and power lines for providing power such as a drive voltage and a common voltage.

Figure 2:
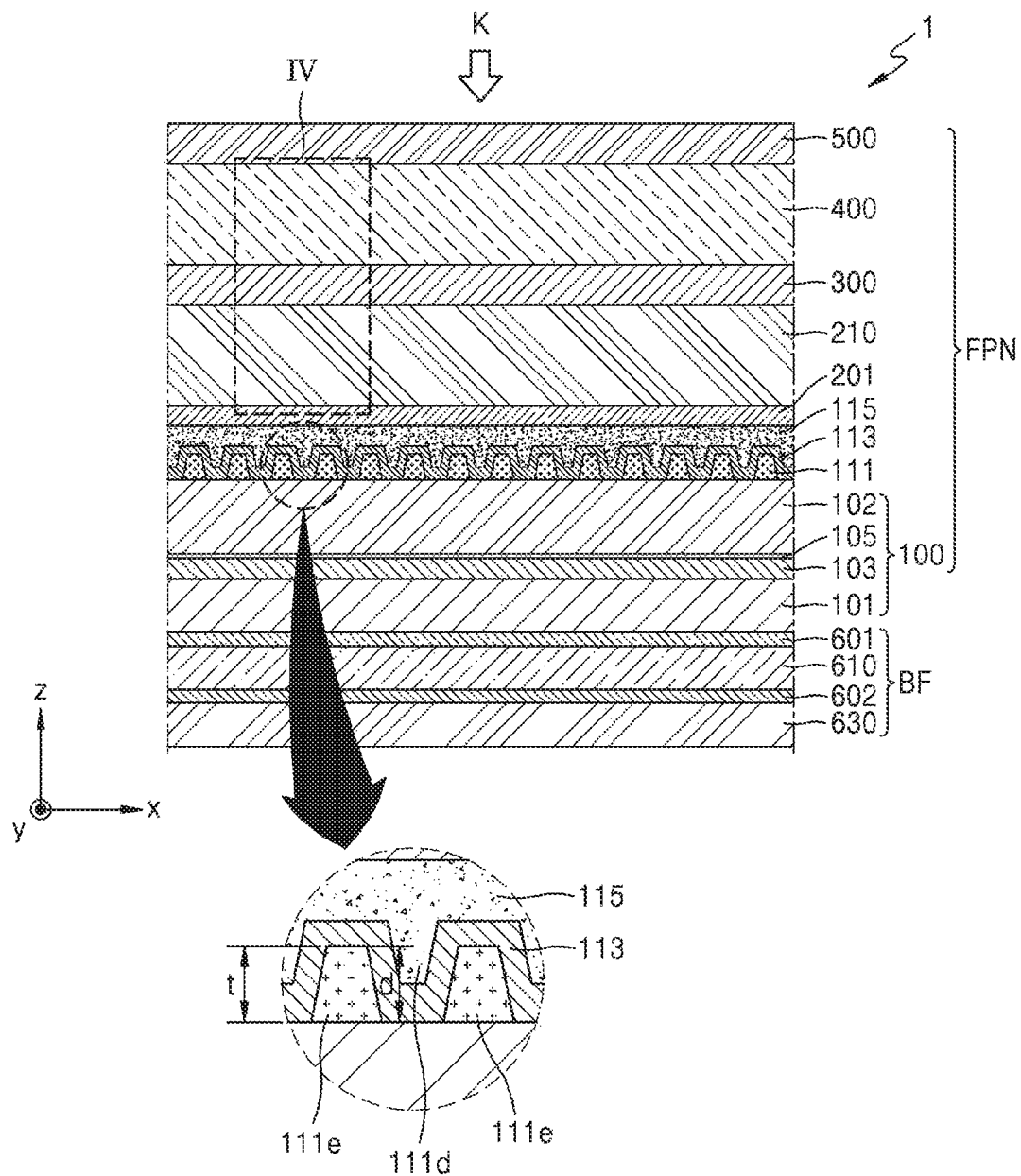
FIG. 2 is a cross-sectional view taken along a line II-II of FIG. 1.
Figure 3A:
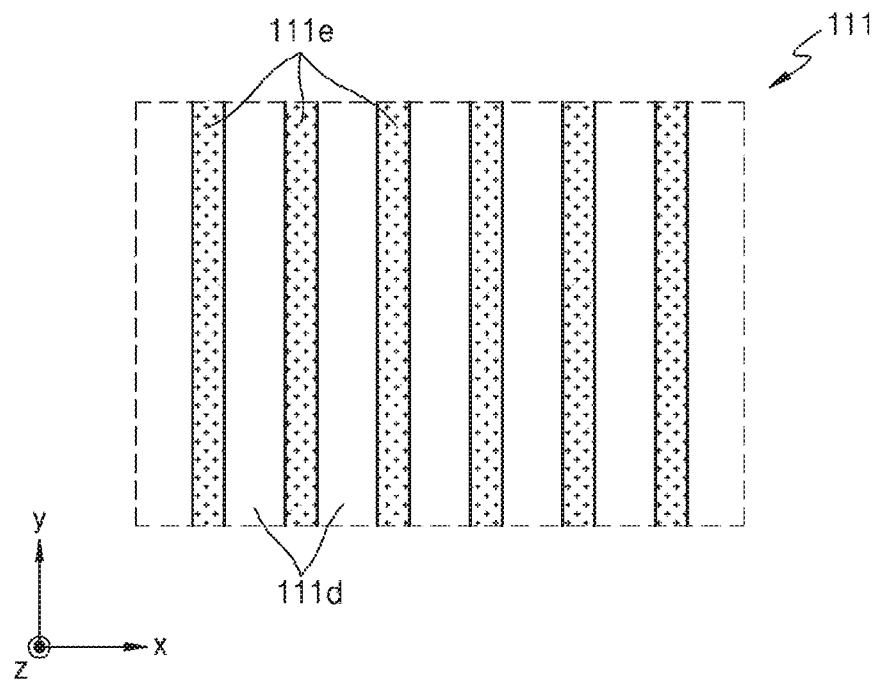
FIGS. 3A and 3B are plan views of an inorganic embossed layer viewed in a direction K of FIG. 2.
Figure 3B:
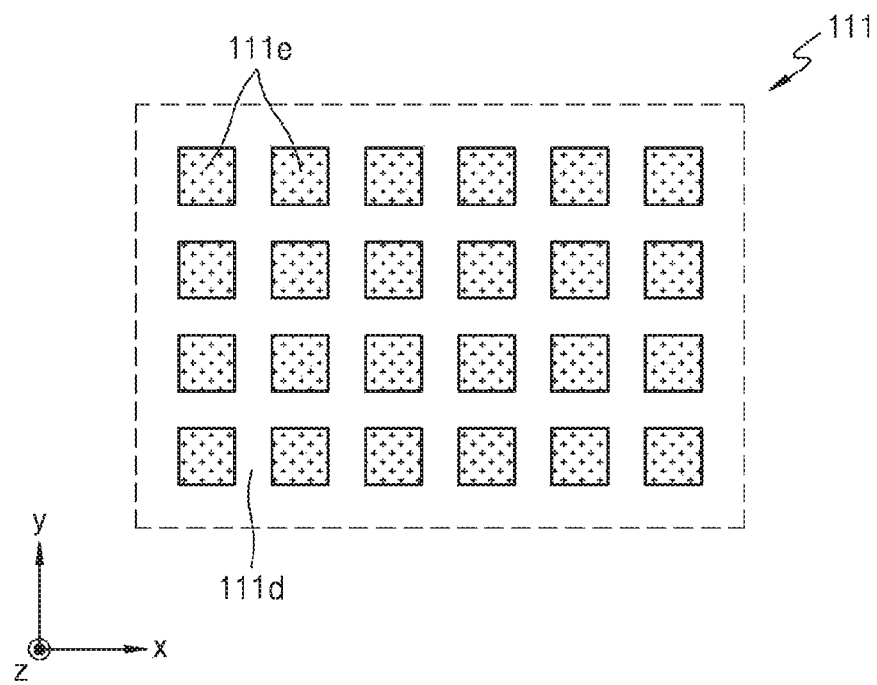
Figure 4A:
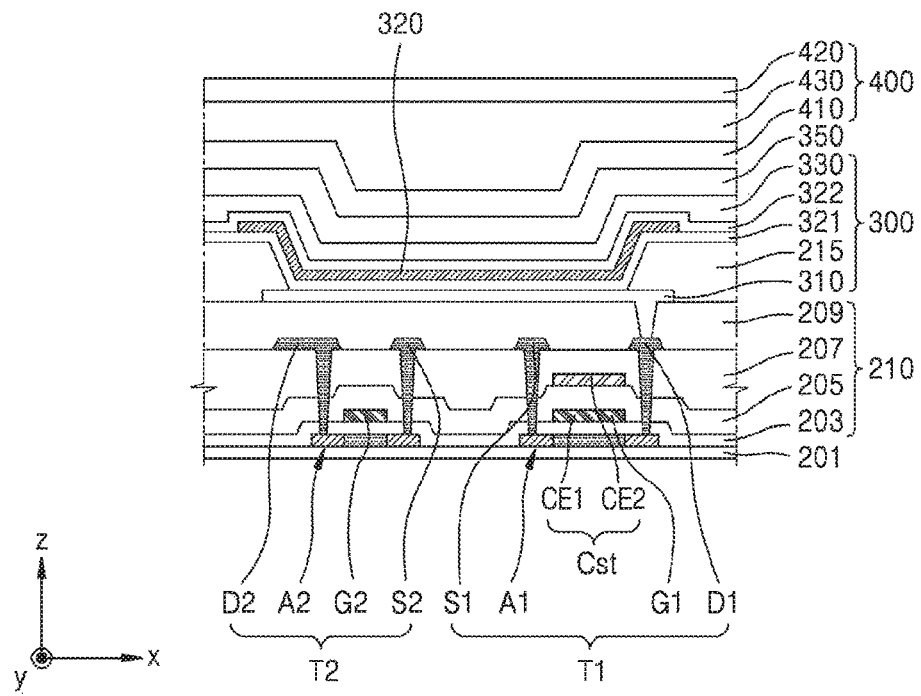
FIGS. 4A and 4B are cross-sectional views of a portion IV of FIG. 2.
Figure 4B:
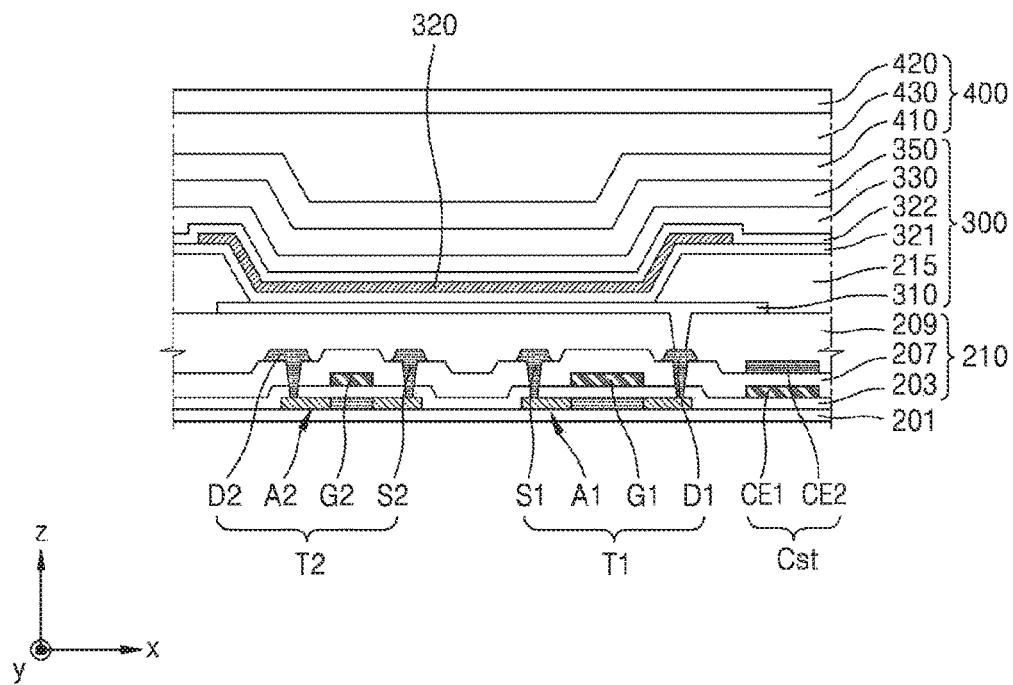

FIG. 2 is a cross-sectional view taken along a line II-II of FIG. 1. FIGS. 3A and 3B are plan views of an inorganic embossed layer viewed in a direction K of FIG. 2. FIGS. 4A and 4B are cross-sectional views of a portion IV of FIG. 2.

Referring to FIG. 2, a substrate 100 has flexible properties and is bendable or rollable. The substrate 100 may include a first plastic layer 101 and a second plastic layer 102, which are flexible, and an inorganic layer 103 interposed between the first and second plastic layers 101 and 102.

The first plastic layer 101 and the second plastic layer 102 may be polyimide (PI), polyethersulphone (PES), polyacrylate (PAR), polyether imide (PEI), polyethylene naphthalate (PEN), polyethylene terephthalate (PET), polyphenylene sulfide (PPS), polyallylate, polycarbonate (PC), cellulose triacetate (TAC), cellulose acetate propionate (CAP), cyclic olefin polymer, cyclic olefin copolymer, etc.

The first plastic layer 101 and the second plastic layer 102 have a shape of a plate with a certain thickness and have flexible properties. The first and second plastic layers 101 and 102 may have a thickness of about 3 μm to about 50 μm. In an embodiment, the first and second plastic layers 101 and 102 may have a thickness of about 3 μm to about 20 μm. In another embodiment, the first and second plastic layers 101 and 102 may have a thickness of about 5 μm to about 10 μm. The first plastic layer 101 and the second plastic layer 102 may have a variety of thicknesses within the above-described range. The thicknesses of the first plastic layer 101 and the second plastic layer 102 may be selected to be the same or to be different from each other.

The inorganic layer 103 may prevent intrusion of external foreign materials such as moisture into the substrate 100. The inorganic layer 103 may be a single layer or a multilayer including an inorganic material such as silicon nitride SiNx and/or silicon oxide SiOx. In an embodiment, the inorganic layer 103 maybe silicon oxide SiOx having a thickness of about 5000 Å to about 6000 Å.

An amorphous silicon layer 105 may be interposed between the inorganic layer 103 and the second plastic layer 102. The amorphous silicon layer 105 may improve an adhesive force between the inorganic layer 103 and the second plastic layer 102. In an embodiment, the amorphous silicon layer 105 may have a thickness of about 10 Å to about 20 Å. For example, the thickness of the amorphous silicon layer 105 may be about 15 Å, however, the present disclosure is not limited thereto. Although FIG. 2 illustrates that the amorphous silicon layer 105 is interposed between the inorganic layer 103 and the second plastic layer 102, in another embodiment, the amorphous silicon layer 105 may be interposed between the inorganic layer 103 and the first plastic layer 101.

An inorganic embossed layer 111 is arranged between the substrate 100 and an inorganic buffer layer 201. As illustrated in an enlarge portion of FIG. 2, the inorganic embossed layer 111 may include a plurality of mountain parts 111e and a plurality of valley parts 111d, each being interposed between the neighboring mountain parts 111e. A depth "d" of each of the valley parts 111d may be equal to or less than a height t of each of the mountain parts 111e. The enlarge portion of FIG. 2 illustrates that the depth d of each of the valley parts 111d is equal to a height t of each of the mountain parts 111e. In one embodiment, the height t of each of the mountain parts 111e may be a thickness of about 5000 Å to about 6000 Å.

Throughout the specification, a height "h" of each of the mountain parts 111e indicates a vertical distance from a lower surface of the inorganic embossed layer 111 to a peak of each of the mountain parts 111e. A depth "d'" of each of the valley parts 111d indicates a vertical distance from an upper surface of the inorganic embossed layer 111 to a lowest point of each of the valley parts 111d.

The mountain parts 111e of the inorganic embossed layer 111 may be arranged in stripes as illustrated in FIG. 3A, or in a shape of an island as illustrated in FIG. 3B. In some embodiments, the valley parts 111d may be arranged spaced from each other by being interposed between the neighboring mountain parts 111e as illustrated in FIG. 3A. In another embodiment, the valley parts 111d may be connected to each other as illustrated in FIG. 3B. The mountain parts 111e and the valley parts 111d arranged in stripes may have various shapes such as a zigzag pattern or a wavy pattern, as long as they are arranged alternately with each other on a plan view, and thus a detail pattern thereof is not limited. The mountain parts 111e in a shape of an island may be formed on a plan view in various shapes, for example, a circular shape, an oval shape, or a polygonal shape such as a triangular shape.

The inorganic embossed layer 111 may have a single layer or a multilayer including an inorganic material such as silicon nitride SiNx and/or silicon oxide SiOx. The inorganic embossed layer 111 is arranged in contact with the substrate 100. In an embodiment, when the inorganic embossed layer 111 is formed of silicon oxide SiOx, the adhesive force to the substrate 100 may be relatively improved compared to the silicon nitride SiNx.

Referring back to FIG. 2, an additional inorganic layer 113 may be arranged on the inorganic embossed layer 111. In some embodiments, when the depth d of each of the valley parts 111d of the inorganic embossed layer 111 is substantially the same as the height t of each of the mountain parts 111e, the additional inorganic layer 113 is formed as an integral part to entirely cover the inorganic embossed layer 111, and thus foreign materials may be prevented from intruding into a circuit element layer 210 and a display element layer 300 by passing through the substrate 100.

The thickness of the additional inorganic layer 113 may be smaller than the thickness of the inorganic embossed layer 111, for example, the height t of each of the mountain parts 111e. Accordingly, the additional inorganic layer 113 may have a structure conforming to an uneven structure formed by the mountain parts 111e and the valley parts 111d of the inorganic embossed layer 111. In other words, an upper surface of the additional inorganic layer 113 may have an uneven surface conforming to the mountain parts 111e. In an embodiment, the thickness of the additional inorganic layer 113 may be about 1000 Å, but the present disclosure is not limited thereto.

The additional inorganic layer 113 may be a single layer or a multilayer including an inorganic material such as silicon nitride SiNx and/or silicon oxide SiOx. In an embodiment, the additional inorganic layer 113 may include silicon nitride SiNx.

An organic layer 115 is arranged on the additional inorganic layer 113. The organic layer 115 is a sort of a planarization layer for planarizing the uneven surface due to the inorganic embossed layer 111. The organic layer 115 is formed as an integral part to entirely cover the inorganic embossed layer 111 and the additional inorganic layer 113. A part of the organic layer 115 may be arranged in the valley parts 111d.

The organic layer 115 may include a polymer material such as an acrylic based polymer, an imide based polymer, an aryl ether based polymer, an amide based polymer, and a phenylene based polymer. In particular, since polyimide or polyphenylene is a material capable of withstanding high temperatures, for example, 300° C. or more, the organic layer 115 may be prevented from being damaged during a high temperature process, for example, a heat treatment process of a thin film transistor, which is performed during a manufacturing process of the display device 1.

The inorganic buffer layer 201 is arranged on the organic layer 115. The inorganic buffer layer 201 may be a single layer or a multilayer including an inorganic material such as silicon nitride SiNx and/or silicon oxide SiOx.

The circuit element layer 210 may include a plurality of circuit devices for driving a display element of the display element layer 300. For example, the circuit element layer 210 may include, as illustrated in FIGS. 4A and 4B, a drive thin film transistor (TFT) T1, a switching TFT T2, and a storage capacitor Cst.

Referring to FIG. 4A, the drive TFT T1 may include a drive semiconductor layer A1, a drive gate electrode G1, a drive source electrode S1, and a drive drain electrode D1. The switching TFT T2 may include a switching semiconductor layer A2, a switching gate electrode G2, a switching source electrode S2, and a switching drain electrode D2. The storage capacitor Cst may include first and second storage capacitor plates CE1 and CE2.

A gate insulating layer 203 is disposed between the drive and switching semiconductor layers A1 and A2 and the drive and switching gate electrodes G1 and G2. A dielectric layer 205 is disposed between the first and second storage capacitor plates CE1 and CE2. An interlayer insulating layer 207 is disposed between the drive and switching gate electrodes G1 and G2 and the drive and switching source/drain electrodes S1, D1, S2, and D2. An insulating layer 209 is disposed on the drive and switching source/drain electrodes S1, D1, S2, and D2.

The gate insulating layer 203 may be a single layer or a multilayer including an inorganic material such as silicon nitride SiNx and/or silicon oxide SiOx. The dielectric layer 205 and the interlayer insulating layer 207 may be a single layer or a multilayer including inorganic materials such as the above-described silicon oxide SiOx and silicon nitride SiNx, and/or aluminum oxide $Al_2O_3$. The insulating layer 209 may include an organic material including a general purpose polymer such as polymethylmethacrylate (PMMA) or polystyrene (PS), a polymer derivative having a phenolic group, an acrylic based polymer, an imide based polymer, an aryl ether based polymer, an amide based polymer, a fluorine based polymer, a p-xylene based polymer, a vinyl alcohol based polymer, and a blend thereof, but the present disclosure is not limited thereto.

FIG. 4A illustrates that the storage capacitor Cst overlaps the drive thin film transistor T1 and the drive gate electrode G1 is the first storage capacitor plate CE1, but the present disclosure is not limited thereto.

Referring to FIG. 4B, the storage capacitor Cst may be arranged not to overlap the drive TFT T1. For example, the first storage capacitor plate CE1 and the drive gate electrode G1 may include the same material, the second storage capacitor plate CE2 may include the same material as the drive source and drain electrodes S1 and D1, and the interlayer insulating layer 207 may be disposed between the first and second storage capacitor plates CE1 and CE2.

According to the embodiments described with reference to FIGS. 4A and 4B, the drive and switching gate electrodes G1 and G2 of the drive and switching thin film transistors T1 and T2 are arranged above the drive and switching semiconductor layers A1 and A2, but the present disclosure is not limited thereto. In another embodiment, the drive and switching gate electrodes G1 and G2 may be arranged under the drive and switching semiconductor layers A1 and A2, respectively. In some embodiments, the drive and switching semiconductor layers A1 and A2 may be arranged directly on the inorganic buffer layer 201 according to the positions of the drive and switching gate electrodes G1 and G2. In other embodiments, the drive and switching gate electrodes G1 and G2 may be arranged directly above the inorganic buffer layer 201.

Referring to FIGS. 2, 4A, and 4B, the display element layer 300 may include the display elements electrically connected to the circuit elements of the circuit element layer 210. The display element may be an organic light-emitting device including a pixel electrode 310, an emission layer 320, and a counter electrode 330. In the organic light-emitting device, excitons are formed as holes and electrons respectively injected by the pixel electrode 310 and the counter electrode 330 are coupled to each other in the emission layer 320, and when the excitons are shifted from an exited state to a ground state, light rays of, for example, red, green, and blue colors are irradiated to the outside.

The pixel electrode 310 is arranged on the insulating layer 209 that is a planarization layer. The pixel electrode 310 may be a metal thin film including silver (Ag) or a silver alloy, or a multilayer of a transparent conductive oxide (TCO) formed on the metal thin film. In one embodiment, the pixel electrode 310 may be a triple layer of ITO/Ag/ITO sequentially having thicknesses of 70 Å/850 Å/50 Å. An edge of the pixel electrode 310 may be covered by a pixel define layer 215 that exposes the pixel electrode 310.

The emission layer 320 may include an organic material that emits a red, green, or blue light ray. The emission layer 320 may be arranged overlapping the pixel electrode 310 that is exposed by the pixel define layer 215. First and second function layers 321 and 322 may be respectively arranged below and over the emission layer 320.

The first function layer 321 is disposed between the pixel electrode 310 and the emission layer 320. The first function layer 321 may include a hole transport layer (HTL), and a hole injection layer (HIL). The second function layer 322 is dispose between the emission layer 320 and the counter electrode 330. The second function layer 322 may include an electron transport layer (ETL) and an electron injection layer (EIL).

The counter electrode 330 may be formed as an integral part to entirely cover the substrate 100. The counter electrode 330 may be a semitransparent metal thin film including at least one of Li, Ca, LiF/Ca, LiF/Al, Al, Mg, Ag, and an alloy of Ag and Mg, which have a low work function. Alternatively, the counter electrode 330 may include the above-described semitransparent metal thin film and a transparent conductive oxide film including ITO, IZO, ZnO, $In_2O_3$, IGO, or AZO arranged on the semitransparent metal thin film.

An encapsulation layer 400 may include at least one inorganic layer and at least one organic layer. The encapsulation layer 400 protects the display element layer 300 from external foreign materials such as moisture. In an embodiment, the encapsulation layer 400 may have a structure in which the inorganic layer and the organic layer are alternately stacked. For example, as illustrated in FIGS. 4A and 4B, the encapsulation layer 400 may include first and second inorganic layers 410 and 420 and an organic layer 430 disposed between the first and second inorganic layers 410 and 420.

The first and second inorganic layers 410 and 420 may include aluminum nitride (AlN), aluminum oxide ($Al_2O_3$) titanium nitride (TiN), titanium oxide ($TiO_2$), silicon oxynitride (SiON), silicon nitride SiNx, or silicon oxide SiOx. The first and second inorganic layers 410 and 420 may protect the display elements from moisture.

The organic layer 430 may include a polymer based material such as polymethylmethacrylate (PMMA), polycarbonate (PC), polystyrene (PS), acrylic based resin, epoxy based resin, polyimide, or polyethylene. The organic layer 430 may be formed to be thicker than the first and second inorganic layers 410 and 420. The organic layer 430 may reduce internal stress of the first and second inorganic layers 410 and 420 and may perform planarization of the first and second inorganic layers 410 and 420 by correcting defects of the first and second inorganic layers 410 and 420.

A barrier layer 350 including LiF to prevent the counter electrode 330 from being damaged during formation of the first and second inorganic layers 410 and 420 may be arranged under the first and second inorganic layers 410 and 420.

A function layer 500 may be arranged on the encapsulation layer 400. The function layer 500 may be a touch electrode layer including electrodes capable of recognizing touch inputs. Alternatively, the function layer 500 may include a plurality of layers having different refractive indexes, or an optical function layer including a lens and/or a polarized plate.

A backing film BF may be arranged on a second surface that is opposite to a first surface of the substrate 100 on which the inorganic embossed layer 111 is arranged. The backing film BF may cover a rear surface of a flexible display panel FPN and may include a rear surface protection layer 610 and a buffer layer 630. The rear surface protection layer 610 may include, for example, polyimide (PI) or polyethylene terephthalate (PET). The buffer layer 630 may include a polymer resin material. Adhesive layers 601 and 602 may be disposed between the substrate 100 and the rear surface protection layer 610, and between the rear surface protection layer 610 and the buffer layer 630, respectively.

Although in the present embodiment the backing film BF is described as including both of the rear surface protection layer 610 and the buffer layer 630, in an embodiment, the backing film BF may include any one of the rear surface protection layer 610 and the buffer layer 630 or may further include another layer, for example, a layer including a black organic material or a metal thin film layer.

Figure 5A:
FIG. 5A is a schematic cross-sectional view of a display device according to an embodiment.
Figure 5B:
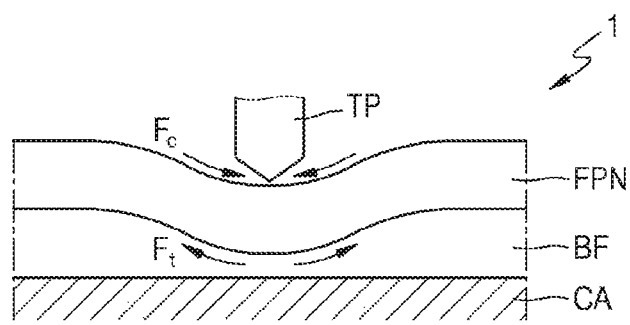
FIG. 5B is a cross-sectional view of the display device of FIG. 5A in a state of receiving an external pressure.

FIG. 5A is a schematic cross-sectional view of the display device 1 according to an embodiment, FIG. 5B is a cross-sectional view of the display device 1 of FIG. 5A in a state of receiving an external pressure or shock.

Referring to FIG. 5A, the display device 1 may include the flexible display panel FPN and the backing film BF arranged under the flexible display panel FPN. The flexible display panel FPN may include the substrate 100, the circuit element layer 210, the display element layer 300, the encapsulation layer 400, and the function layer 500, which are described with reference to FIG. 2.

In one embodiment, when the display device 1 is adopted in electronic devices such as mobile phones, smart watches, or tablet PCs, a structure CA such as an internal barrier or a rear surface case may be arranged on a rear surface of the display device 1. Although not illustrated, a protection cover may be further arranged on the flexible display panel FPN.

As illustrated in FIG. 5B, when a certain pressure or shock is applied to the display device 1 by an external input device such as a touch pen TP or other various objects, the display device 1 may be deformed at around a position where the pressure is applied. For example, a compression force $F_c$ is applied to an upper portion of the flexible display panel FPN at around the position where the pressure is applied, whereas a tension force $F_t$ may be applied to a lower end of the flexible display panel FPN. The flexible display panel FPN is more vulnerable to the tension force $F_t$ applied to the lower portion of the flexible display panel FPN among the compression force $F_c$ and the tension force $F_t$. For example, various layers provided in the flexible display panel FPN may have cracks or may be deformed by the tension force $F_t$. However, the display device 1 may distribute the tension force $F_t$ through the inorganic embossed layer 111 including the mountain parts 111e and the valley parts 111d, as described above with reference to FIG. 2.

Figure 6:
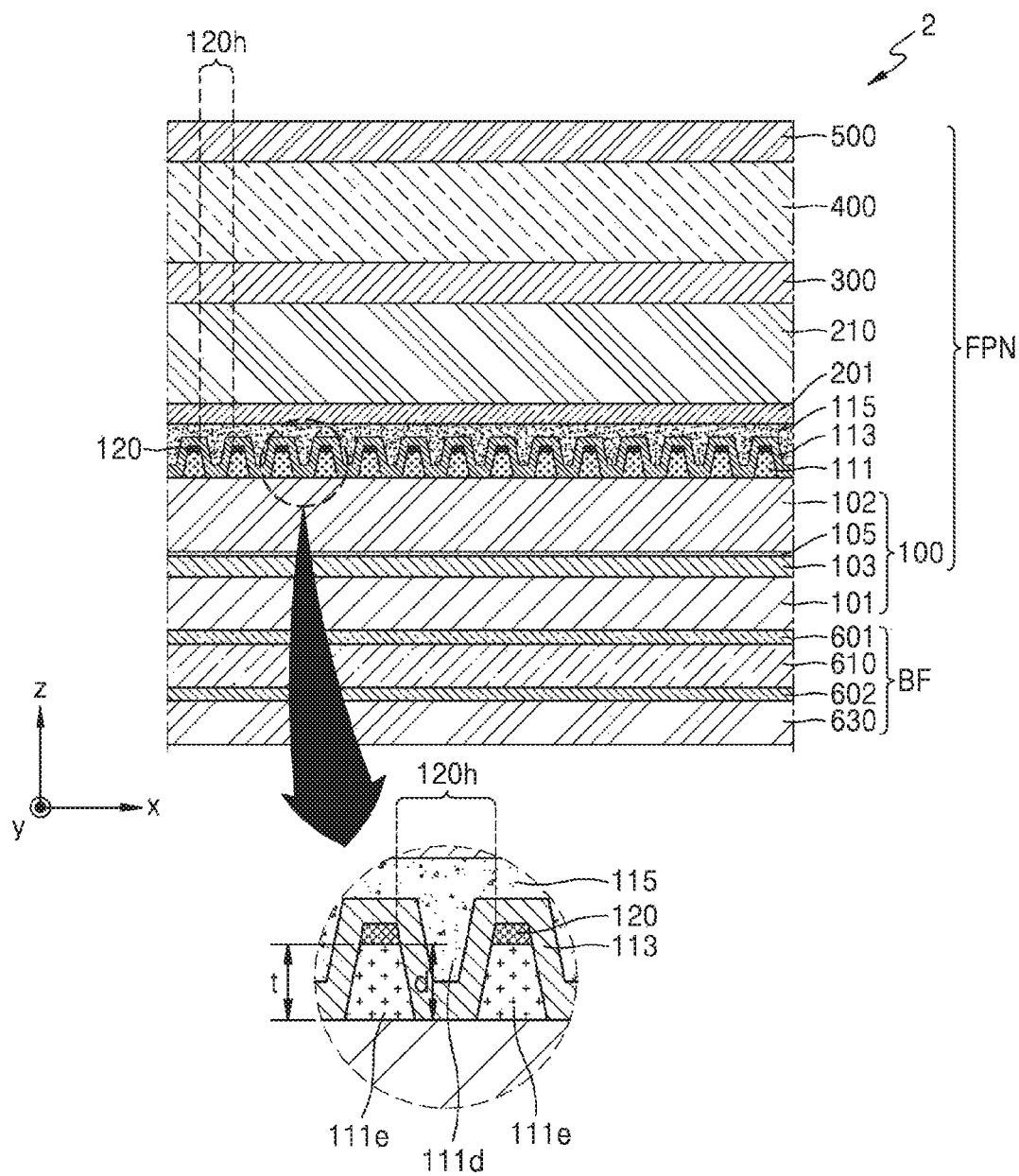
FIG. 6 is a schematic cross-sectional view of a display device according to another embodiment.

FIG. 6 is a schematic cross-sectional view of a display device 2 according to another embodiment. Since the display device 2 has a similar structure to the display device 1 of FIG. 2, differences from the display device 2 are mainly described below.

Referring to FIG. 6, the display device 2 may further include a metal pattern layer 120 arranged on the inorganic embossed layer 111. The metal pattern layer 120 may include a metal material. For example, the metal pattern layer 120 may include a material, such as molybdenum (Mo), titanium (Ti), and titanium nitride (TiN), capable of enduring a relatively high temperature, for example, 300° C. or more.

The metal pattern layer 120 is located corresponding to the mountain parts 111e and covering the mountain parts 111e. The metal pattern layer 120 may include an opening 120h corresponding to the valley parts 111d. Since the metal pattern layer 120 includes a metal material exhibiting a relatively higher ductility than an inorganic material such as the inorganic embossed layer 111 and/or the additional inorganic layer 113, the metal pattern layer 120 is capable of dispersing impact, without being broken, even when a tension force due to an external pressure or impact is applied.

The metal pattern layer 120 may function as a mask covering the inorganic embossed layer 111 in a process of patterning the mountain parts 111e and the valley parts 111d on the inorganic embossed layer 111. For example, after a preliminary inorganic embossed layer (not shown) having a uniform thickness is formed and the metal pattern layer 120 having a certain pattern is formed on the preliminary inorganic embossed layer, a portion of the preliminary inorganic embossed layer corresponding to the valley parts 111d is etched by using the metal pattern layer 120 as a mask and thus the inorganic embossed layer 111 having the mountain parts 111e and the valley parts 111d may be formed.

Figure 7:
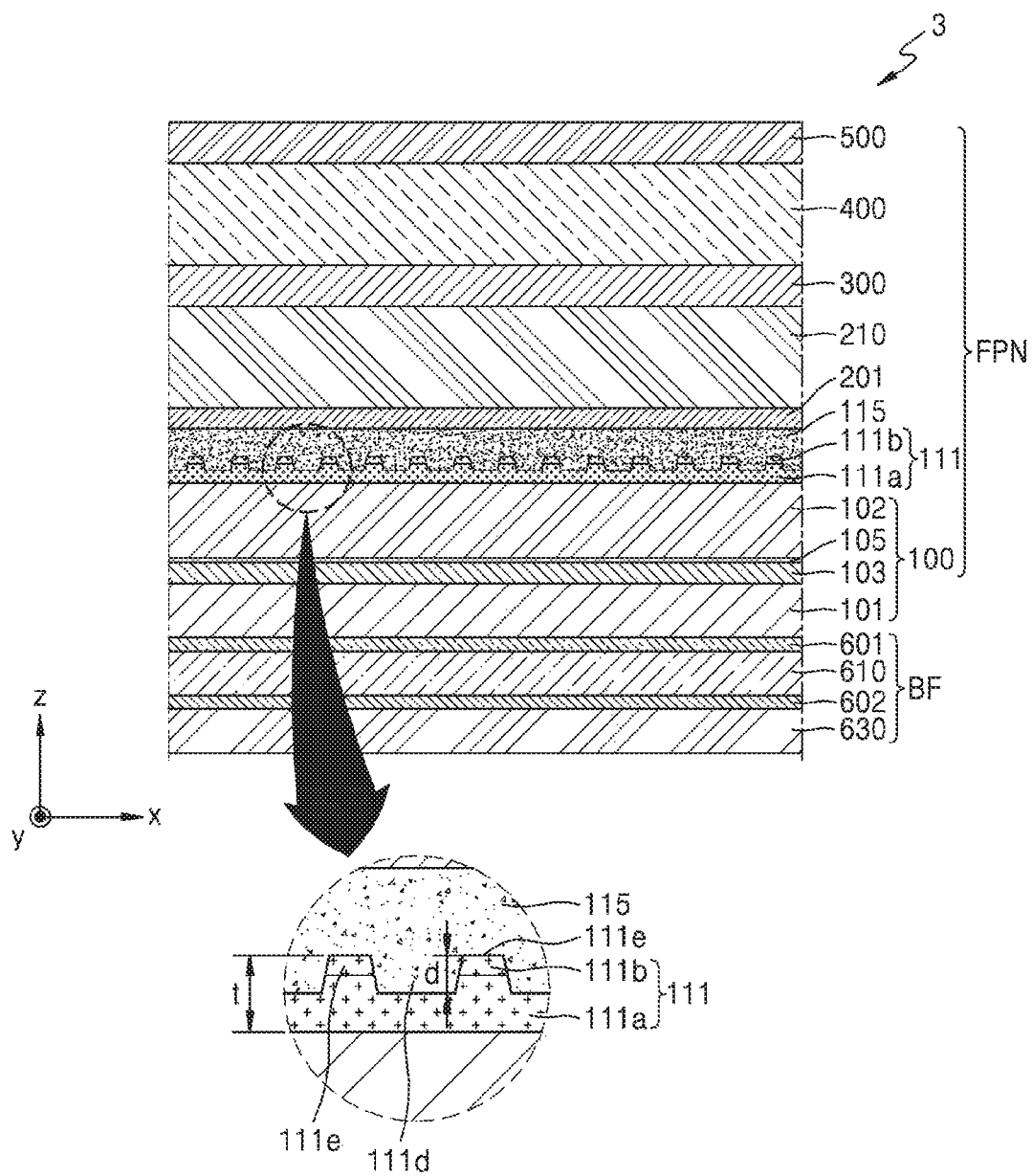
FIG. 7 is a schematic cross-sectional view of a display device according to another embodiment.

FIG. 7 is a schematic cross-sectional view of a display device 3 according to another embodiment. Since the display device 3 has a structure similar to the display device 1 described in FIG. 2, the following description mainly focuses on differences between the display devices 1 and 3.

Referring to FIG. 7, the inorganic embossed layer 111 of the display device 3 may be formed in a plurality of layers. For example, the inorganic embossed layer 111 may include a first inorganic embossed layer 111a and a second inorganic embossed layer 111b. The depth d of each of the valley parts 111d may be formed to be smaller than the height t of each of the mountain parts 111e.

The first and second inorganic embossed layers 111a and 111b may include different materials. In one embodiment, the first inorganic embossed layer 111a may include silicon oxide SiOx, whereas the second inorganic embossed layer 111b may include silicon nitride SiNx. The first inorganic embossed layer 111a may be arranged to entirely cover the substrate 100, and a part of the first inorganic embossed layer 111a corresponding to the valley parts 111d may be concave in a thickness direction. The second inorganic embossed layer 111b, in which a portion corresponding to the valley parts 111d is removed, may be left only at a position corresponding to the mountain parts 111e.

In some embodiments, when the inorganic embossed layer 111, in which the depth d of each of the valley parts 111d is formed to be smaller than the height t of each of the mountain parts 111e, is provided, the organic layer 115 may directly contact the inorganic embossed layer 111.

Figure 8:
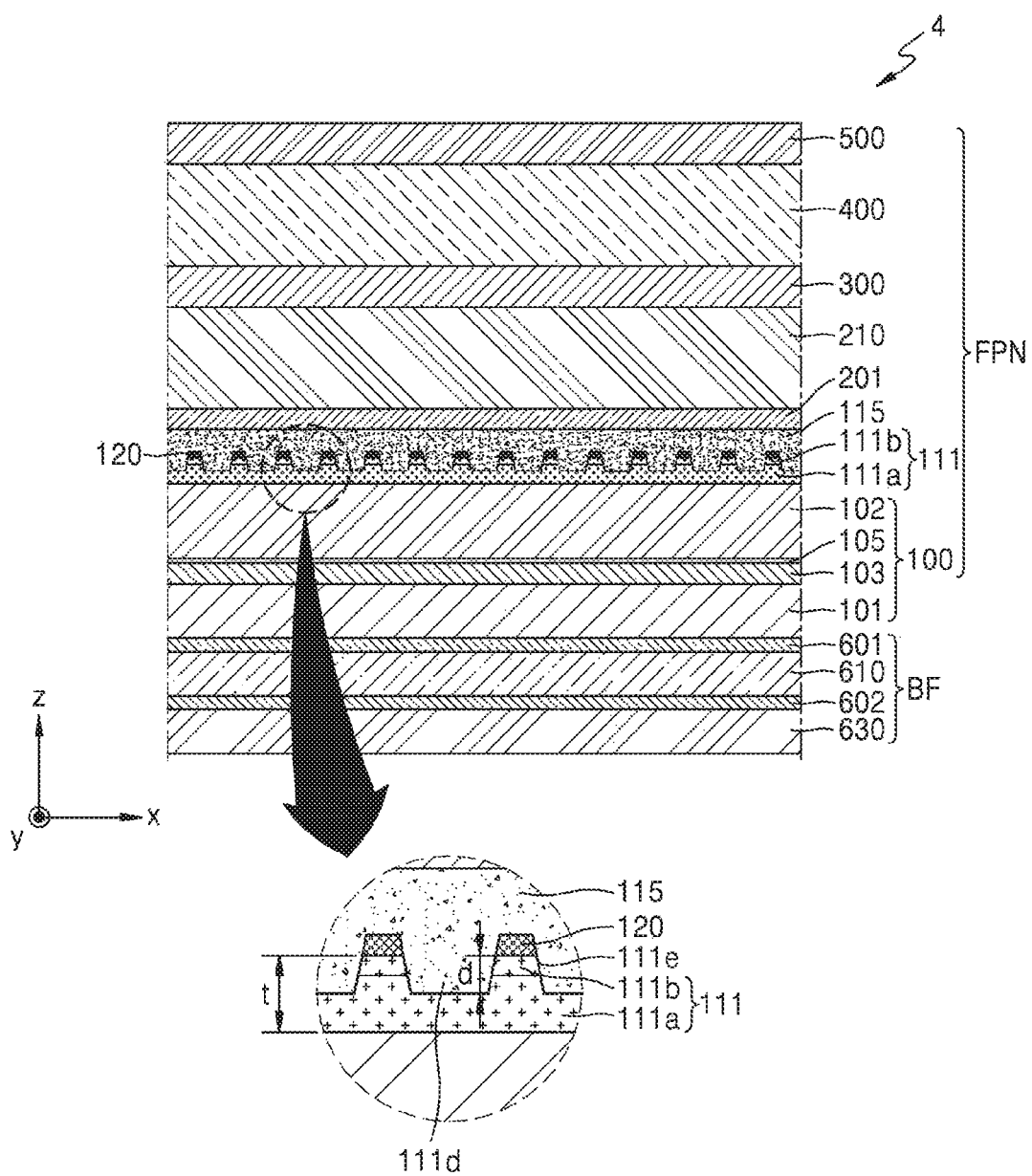
FIG. 8 is a schematic cross-sectional view of a display device according to another embodiment.

FIG. 8 is a schematic cross-sectional view of a display device 4 according to another embodiment. Since the display device 4 has a structure similar to the display device 3 described in FIG. 7, the following description mainly focuses on differences between the display devices 3 and 4.

Referring to FIG. 8, the display device 4 may further include the metal pattern layer 120 arranged on the inorganic embossed layer 111. The metal pattern layer 120 may include a metal material. For example, the metal pattern layer 120 may include a material, such as molybdenum (Mo), titanium (Ti), and titanium nitride (TiN), capable of enduring a relatively high temperature, for example, 300° C. or more.

The metal pattern layer 120 is located corresponding to the mountain parts 111e and covering the mountain parts 111e. The metal pattern layer 120 may include the opening 120h that corresponds to the valley parts 111d as shown in FIG. 6. Since the metal pattern layer 120 includes a metal material exhibiting a relatively higher ductility than an inorganic material such as the inorganic embossed layer 111 and/or the additional inorganic layer 113, the metal pattern layer 120 is capable of dispersing impact, without being broken, even when a tension force due to an external pressure or impact is applied. Furthermore, as described above, the metal pattern layer 120 may be used as a mask in the patterning process (etch process) of the inorganic embossed layer 111.

As described above, in the display devices according to the above-described embodiments, since the inorganic embossed layer including the mountain parts and the valley parts disperses external pressure or impact, the generation of cracks in a lower end of a display device, for example, in the layers adjacent to the substrate, due to pressure or impact, may be prevented.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a substrate comprising a first plastic layer, a second plastic layer on the first plastic layer, and an inorganic layer between the first plastic layer and the second plastic layer;
    an inorganic embossed layer on the substrate and comprising a plurality of mountain parts;
    an organic layer on the inorganic embossed layer;
    an inorganic buffer layer on the organic layer;
    a thin film transistor on the inorganic buffer layer; and
    a display element electrically connected to the thin film transistor.

2. The display device of claim 1, wherein the inorganic embossed layer comprises a valley part between neighboring mountain parts of the plurality of mountain parts, and a part of the organic layer is arranged in the valley part.

3. The display device of claim 2, wherein a depth of the valley part is equal to or smaller than a height of each of the plurality of mountain parts.

4. The display device of claim 1, wherein the inorganic embossed layer comprises at least one of silicon oxide and silicon nitride.

5. The display device of claim 1, further comprising a metal pattern layer located to correspond to the plurality of mountain parts, the metal pattern layer being between the inorganic embossed layer and the organic layer.

6. The display device of claim 5, wherein the metal pattern layer comprises at least one of molybdenum, titanium, and titanium nitride.

7. The display device of claim 6, wherein the metal pattern layer comprises an opening corresponding to neighboring mounting parts of the plurality of mountain parts.

8. The display device of claim 1, further comprising an additional inorganic layer disposed between the inorganic embossed layer and the organic layer.

9. The display device of claim 8, wherein the additional inorganic layer has an uneven surface conforming to the plurality of mountain parts of the inorganic embossed layer.

10. The display device of claim 1, wherein the first plastic layer and the second plastic layer are flexible.

11. The display device of claim 1, wherein the substrate comprises a first surface facing the inorganic embossed layer and a second surface opposite to the first surface, and the display device further comprises a backing film on the second surface of the substrate.

12. The display device of claim 11, further comprising an adhesive layer disposed between the substrate and the backing film.

13. The display device of claim 1, wherein the thin film transistor comprises semiconductor layer and a gate electrode overlapping a channel area of the semiconductor layer.

14. The display device of claim 13, wherein any one of the semiconductor layer and the gate electrode contacts the inorganic buffer layer.

15. The display device of claim 1, wherein the display element comprises:
   a pixel electrode electrically connected to the thin film transistor;
   an emission layer on the pixel electrode; and
   a counter electrode on the emission layer.

* * * * *